US012500184B2

United States Patent
Chen et al.

(10) Patent No.: US 12,500,184 B2
(45) Date of Patent: Dec. 16, 2025

(54) DUAL SIDE SEAL RINGS

(71) Applicant: Taiwan Semiconductor Manufacturing Company, Ltd., Hsinchu (TW)

(72) Inventors: Chun Yu Chen, Hsinchu (TW); Yen Lian Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 485 days.

(21) Appl. No.: 17/708,852

(22) Filed: Mar. 30, 2022

(65) Prior Publication Data

US 2023/0154870 A1    May 18, 2023

Related U.S. Application Data

(60) Provisional application No. 63/280,269, filed on Nov. 17, 2021.

(51) Int. Cl.
*H01L 23/48* (2006.01)
*H01L 23/04* (2006.01)
*H01L 23/58* (2006.01)

(52) U.S. Cl.
CPC ............ *H01L 23/585* (2013.01); *H01L 23/04* (2013.01); *H01L 23/481* (2013.01)

(58) Field of Classification Search
CPC ......... H01L 21/78–786; H01L 21/3043; H01L 23/585; H01L 23/481; H01L 23/562
See application file for complete search history.

(56) References Cited

U.S. PATENT DOCUMENTS

| | | | |
|---|---|---|---|
| 8,461,021 B2 * | 6/2013 | Yaung | H01L 21/78 438/460 |
| 2003/0194830 A1 * | 10/2003 | Chung | H01L 23/3114 438/106 |

(Continued)

FOREIGN PATENT DOCUMENTS

| | | |
|---|---|---|
| JP | 2008270232 A | 11/2008 |
| KR | 20170078538 A | 7/2017 |
| KR | 20210134218 A | 11/2021 |

OTHER PUBLICATIONS

Chun Yu Chen et al., Seal Structures, U.S. Appl. No. 17/465,556, filed Sep. 2, 2021, Assignee: Taiwan Semiconductor Manufacturing Company, Ltd., 32 pages specification, 13 pages drawings.

(Continued)

*Primary Examiner* — Ismail A Muse
(74) *Attorney, Agent, or Firm* — HAYNES AND BOONE, LLP

(57) ABSTRACT

A semiconductor structure with dual side seal rings is provided. A semiconductor structure according to the present disclosure include a substrate including a device region and a ring region surrounding the device region, a frontside interconnect structure disposed over the substrate and including a frontside interconnect region and a frontside seal ring region, and a backside interconnect structure disposed below the substrate and including a backside interconnect region and a backside seal ring region. The frontside interconnect region is disposed over the device region and the backside interconnect region is disposed below the device region. The frontside seal ring region is disposed over the ring region and the backside seal ring region is disposed below the ring region.

20 Claims, 12 Drawing Sheets

(56) References Cited

U.S. PATENT DOCUMENTS

| | | | | |
|---|---|---|---|---|
| 2011/0201179 A1* | 8/2011 | Li | ............................ | H01L 21/78 |
| | | | | 257/E21.599 |
| 2011/0309465 A1* | 12/2011 | Chen | ..................... | H01L 23/585 |
| | | | | 257/503 |
| 2015/0069609 A1 | 3/2015 | Farooq | | |
| 2019/0371741 A1* | 12/2019 | Wang | ..................... | H01L 23/562 |
| 2020/0027860 A1* | 1/2020 | Chu | ......................... | H01L 24/80 |
| 2020/0035672 A1 | 1/2020 | Thei | | |
| 2020/0066657 A1* | 2/2020 | Huang | ..................... | H01L 23/10 |

OTHER PUBLICATIONS

Chun Yu Chen et al., Seal Ring Structures, U.S. Appl. No. 17/581,251, filed Jan. 1, 2022, Assignee: Taiwan Semiconductor Manufacturing Company, Ltd., 31 pages specification, 10 pages drawings.

Chun Yu Chen et al., Seal Structures Including Passivation Structures, U.S. Appl. No. 17/703,668, filed Mar. 24, 2022, Assignee: Taiwan Semiconductor Manufacturing Company, Ltd., 24 pages specification, 9 pages drawings.

* cited by examiner

DUAL SIDE SEAL RINGS

PRIORITY DATA

This application claims priority to U.S. Provisional Patent Application Ser. No. 63/280,269, filed Nov. 17, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Structures of the transistors may be susceptible to damages due to mist ingress or stress during singulation. Seal structures have been implemented to protect semiconductor devices. While existing seal structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
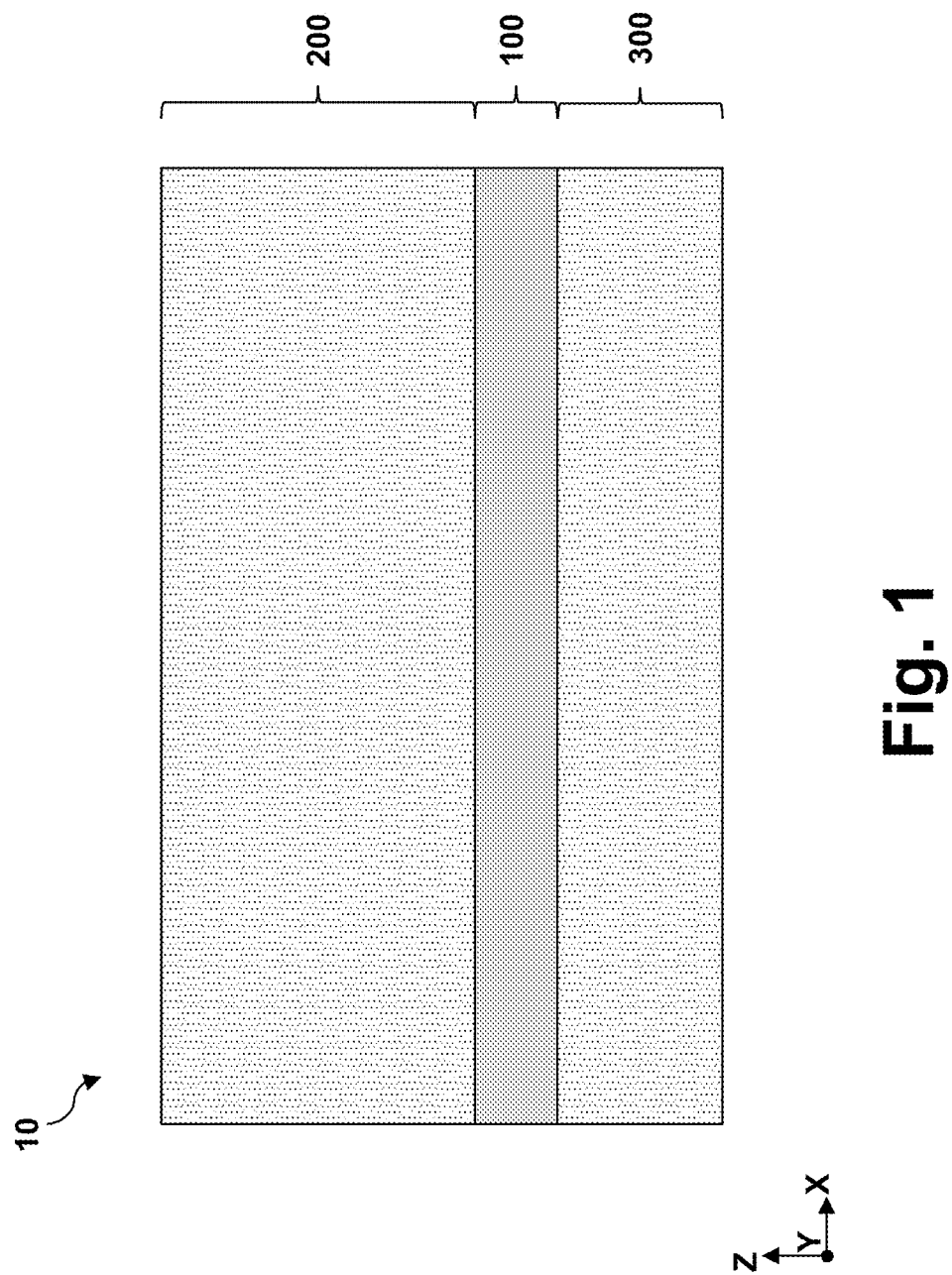
FIG. 1 illustrates a cross-sectional view of an integrated circuit (IC) chip including a substrate, a frontside interconnect structure and a backside interconnect structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

Seal structures are used to prevent semiconductor devices in an integrated circuit (IC) chip from being damaged due to mist ingress or stress generated during singulation of the IC chip. Semiconductor devices being protected by seal structures may include planar devices and multi-gate devices.

Planar devices include a semiconductor body embedded in a dielectric layer and a gate structure that engages a top surface of the semiconductor body. Multi-gate devices, such as FinFETs and MBC transistors, include one or more semiconductor bodies rising above a substrate and a gate structure that engages two or more surfaces of the one or more semiconductor bodies. In some existing technology, seal ring structures may be present in the front-end-of-line (FEOL) structures, the middle-end-of-line (MEOL) structures, or in frontside back-end-of-line (BEOL) structures. As used herein, FEOL structures include structural features of transistors or other semiconductor devices fabricated on a semiconductor substrate; MEOL structures include source/drain contact vias or gate contact vias; and BEOL structure include interconnect structures, top contact pads over the interconnect structure, and passivation structures over top contact pads. In these existing technology, a back side of the IC chip may not be well protected or at least may not be protected by seal ring structures The present disclosure provides embodiments of an IC chip that is protected by dual side seal ring structures. An IC chip according to embodiments of the present disclosure includes a substrate, a frontside interconnect structure disposed over the substrate, a backside interconnect structure disposed below the substrate, a frontside passivation structure over the frontside interconnect structure, and a backside passivation structure below the backside interconnect structure. The substrate includes a device region and a ring region surrounding the device region. The frontside interconnect structure includes a frontside interconnect region directly over the device region and a frontside seal ring region directly over the ring region. The backside interconnect structure includes a backside interconnect region directly below the device region and a backside seal ring region directly below the ring region. Each of the frontside passivation structure and the backside passivation structure includes passivation layers, pad structures and a polymer layer. Each of the frontside seal ring region, the backside seal ring region, the frontside passivation structure, and the backside passivation structure includes ring-shape structures that extend completely around a vertical projection of the device region to prevent damages from stress and ingress.

Figure 2:
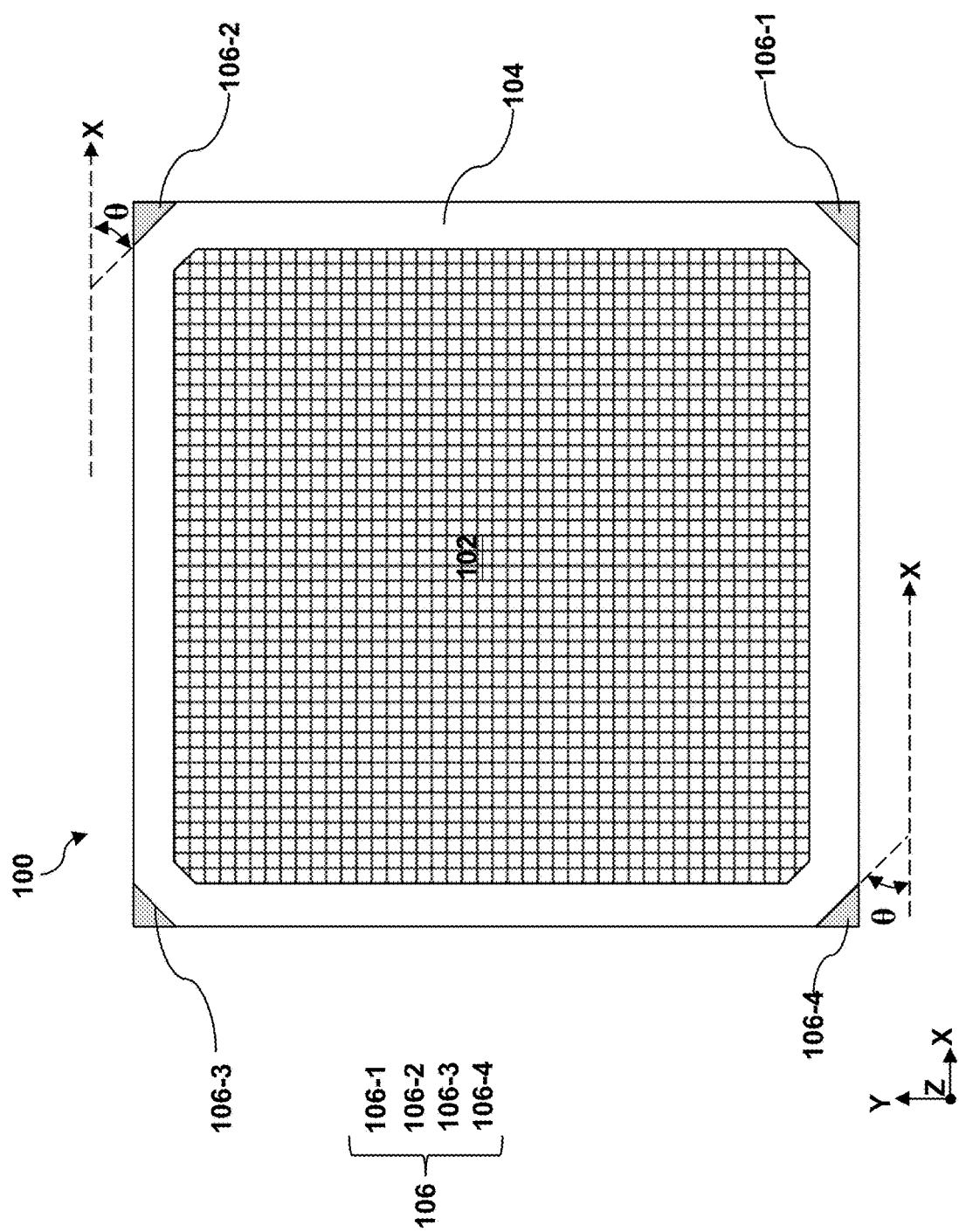
FIG. 2 illustrates a top view of the substrate in FIG. 1, according to one or more aspects of the present disclosure.

FIG. 1 illustrates a schematic cross-sectional view of an integrated circuit (IC) chip 10 that includes a substrate 100, a frontside interconnect structure 200 disposed over the substrate 100 along the Z direction, and a backside interconnect structure 300 disposed below the substrate 100 along the Z direction. Put differently, the backside interconnect structure 300 is disposed over a backside surface of the substrate 100. FIG. 2 illustrates a top view of the substrate 100.

FIG. 2 provides a schematic top view of the substrate 100 of the chip 10 shown in FIG. 1. As shown in FIG. 2, the substrate 100 includes a device region 102, a ring region 104 continuously surrounding the device region 102, and four corner areas 106 disposed at outer corners of the ring region 104. The corner areas 106 include a first corner area 106-1, a second corner area 106-2, a third corner area 106-3, and a fourth corner area 106-4. For ease of reference, the first corner area 106-1, the second corner area 106-2, the third corner area 106-3, and the fourth corner area 106-4 may be collectively or respectively referred to as corner areas 106 or a corner area 106. The substrate 100, the device region 102, and the ring region 104 may be substantially rectangular when viewed along the Z direction from the top. Each of the corner areas 106 has a shape of a right triangle. In the embodiments represented in FIG. 1, each of the right triangles in the corner areas 106 is an isosceles triangle. In other words, the hypotenuse of each of the corner areas 106 forms an angle θ with the X direction or the Y direction. The angle θ may be about 45°. In the depicted embodiments, the device region 102 includes four cut-off corners that include an edge parallel to the hypotenuse of the adjacent corner area 106. The ring region 104, while being largely rectangular in shape, is disposed between and engages the corner areas 106 and the device region 102. That is, the ring region 104 includes cut-off outer corners that correspond to the corner areas 106 and push-out inner corners that correspond to the four corners of the device region 102.

In some embodiments, the substrate 100 may be a bulk silicon (Si) substrate. Alternatively, substrate 100 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 100 includes one or more group III-V materials, one or more group II-VI materials, or combinations thereof. In still some instances, the substrate 100 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 100 may be diamond substrate or a sapphire substrate.

The substrate 100 may include various semiconductor structures, such as active regions, gate structures disposed over channel regions of the active regions, source/drain features disposed over source/drain regions of the active regions, source/drain contacts disposed over source/drain features, and gate contact vias disposed over the gate structures. The active regions may include silicon (Si) or a suitable semiconductor material, such as germanium (Ge) or silicon germanium (SiGe). Each of the gate structures includes a gate dielectric layer and a gate electrode layer over the gate dielectric layer. In some embodiments, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed using ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The sourced/drain contacts may include a barrier layer, a silicide layer, and a metal fill layer disposed over the silicide layer. The barrier layer may include titanium nitride or tantalum nitride and functions to prevent electro-migration in the metal fill layer. The silicide layer may include titanium silicide, tantalum silicide, cobalt silicide, nickel silicide, or tungsten silicide. The silicide layer is disposed at the interface between the metal fill layer and the source/drain features to reduce contact resistance. The metal fill layer may include ruthenium (Ru), copper (Cu), nickel (Ni), cobalt (Co), or tungsten (W).

The semiconductor structures in the substrate 100 may include transistors, such as planar transistors or multi-gate transistors, or passive devices. Planar transistors include a semiconductor body embedded in a dielectric layer and a gate structure engages one surface of the semiconductor body. Examples of multi-gate transistors may include fin-like field effect transistors (FinFETs) and multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. When transistors in the substrate 100 are FinFETs, the active regions may include fin-like semiconductor structures rising above an isolation feature and the gate structures are disposed over the fin-like semiconductor structures to engage two or three surfaces of the fin-like semiconductor structures. When transistors in the substrate 100 are MBC transistors, the active regions may each include a vertical stack of nanostructures and the gate structure wraps around each of nanostructures in the vertical stack of nanostructures. The nanostructures may have different cross-sections. In some instances, the nanostructures have a width substantially similar to its thickness and may be referred to as nanowires. In some other instances, the nanostructures have a width greater than to its thickness and may be referred to as nanosheets.

Figure 3:
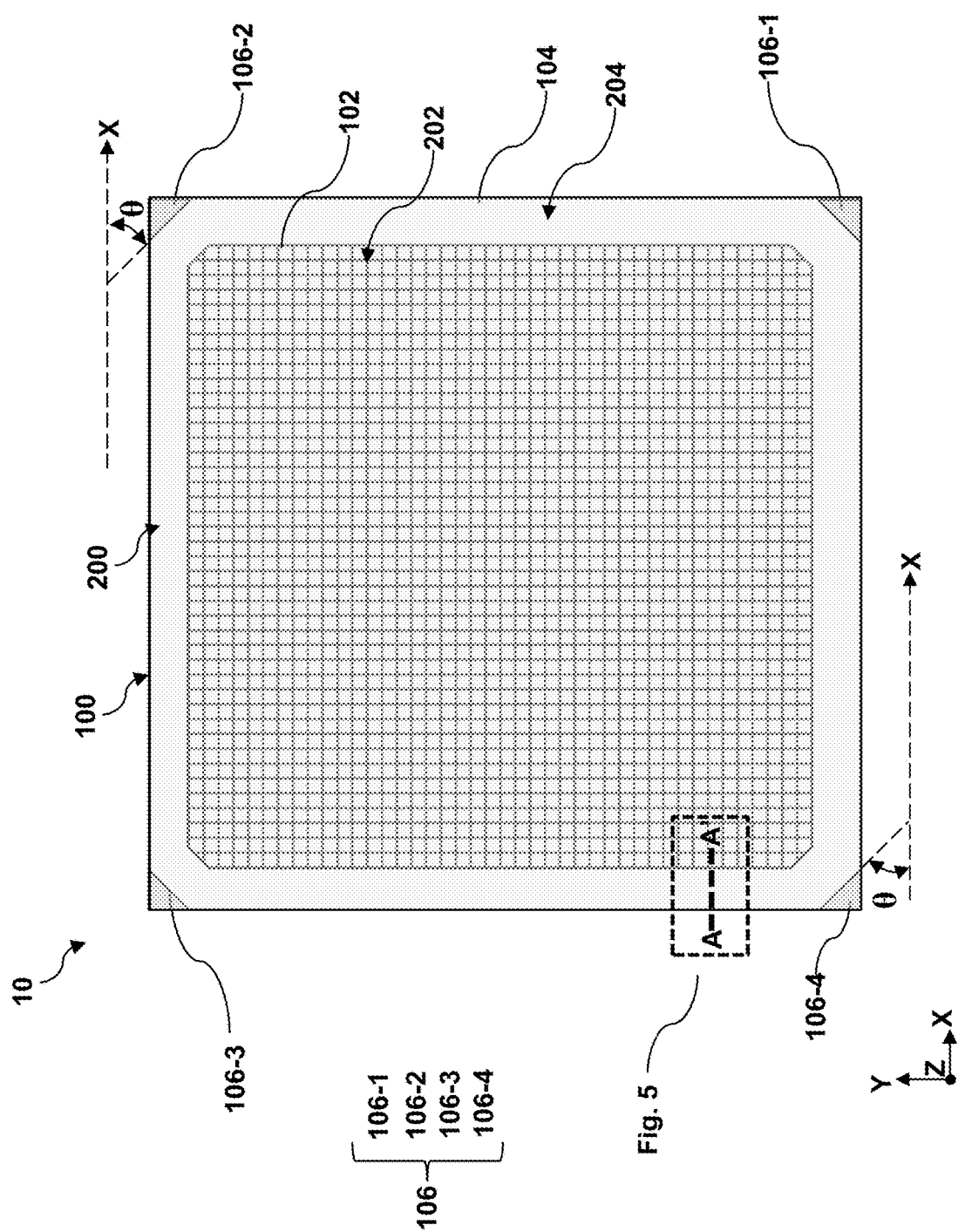
FIG. 3 illustrates a frontside top view of the frontside interconnect structure in FIG. 1, according to one or more aspects of the present disclosure.
Figure 5:
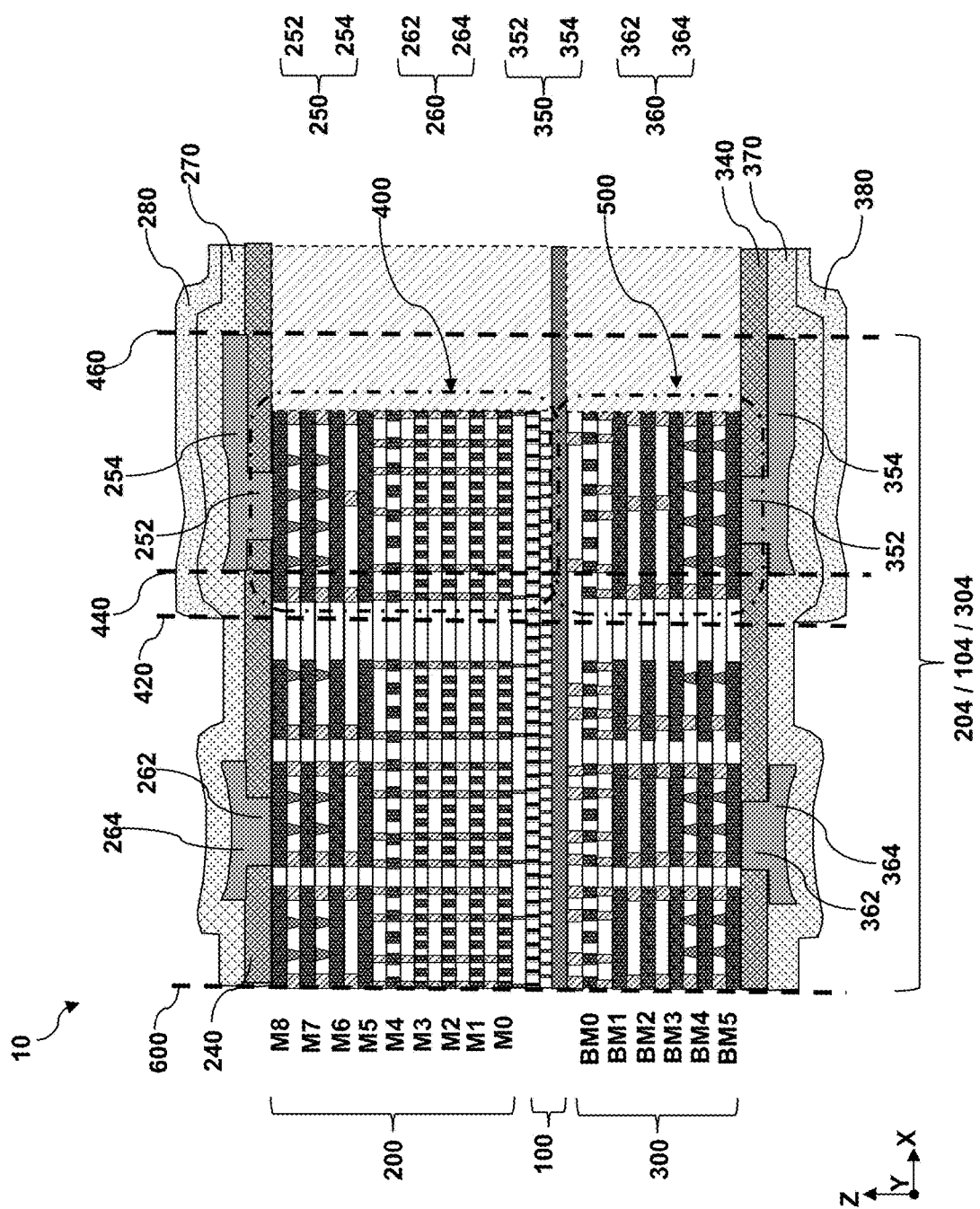
FIG. 5 illustrates an enlarged fragmentary cross-sectional view of a portion of the interconnect structures disposed over and below a ring region of the substrate in FIG. 3, according to one or more aspects of the present disclosure.

The frontside interconnect structure 200 shown in FIG. 1 may include 8 to 14 metal layers. Each of the metal layers includes conductive lines embedded in an intermetal dielectric (IMD) layer. The frontside interconnect structure 200 also includes contact vias that vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include aluminum (Al), copper (Cu), titanium nitride (TiN), tungsten (W), or ruthenium (Ru). Reference is now made to FIG. 3, which illustrates a top view of the frontside interconnect structure 200 disposed over the substrate 100. For illustration purposes, the frontside interconnect structure 200 is illustrated as a see-though layer in FIG. 3. As shown in FIG. 3, the frontside interconnect structure 200 covers the entirety of the substrate 100 and includes various portions vertically (i.e., along the Z direction) corresponding to various regions of the substrate 100. In the depicted embodiment, the frontside interconnect structure 200 includes a frontside interconnect region 202 directly over the device region 102 of the substrate 100 and a frontside ring region 204 directly over the ring region 104 of the substrate 100. Various features of the frontside interconnect structure 200 will be described in more detail below. FIG. 5 illustrates a cross-sectional view across the frontside ring region 204 along line A-A'.

Figure 4:
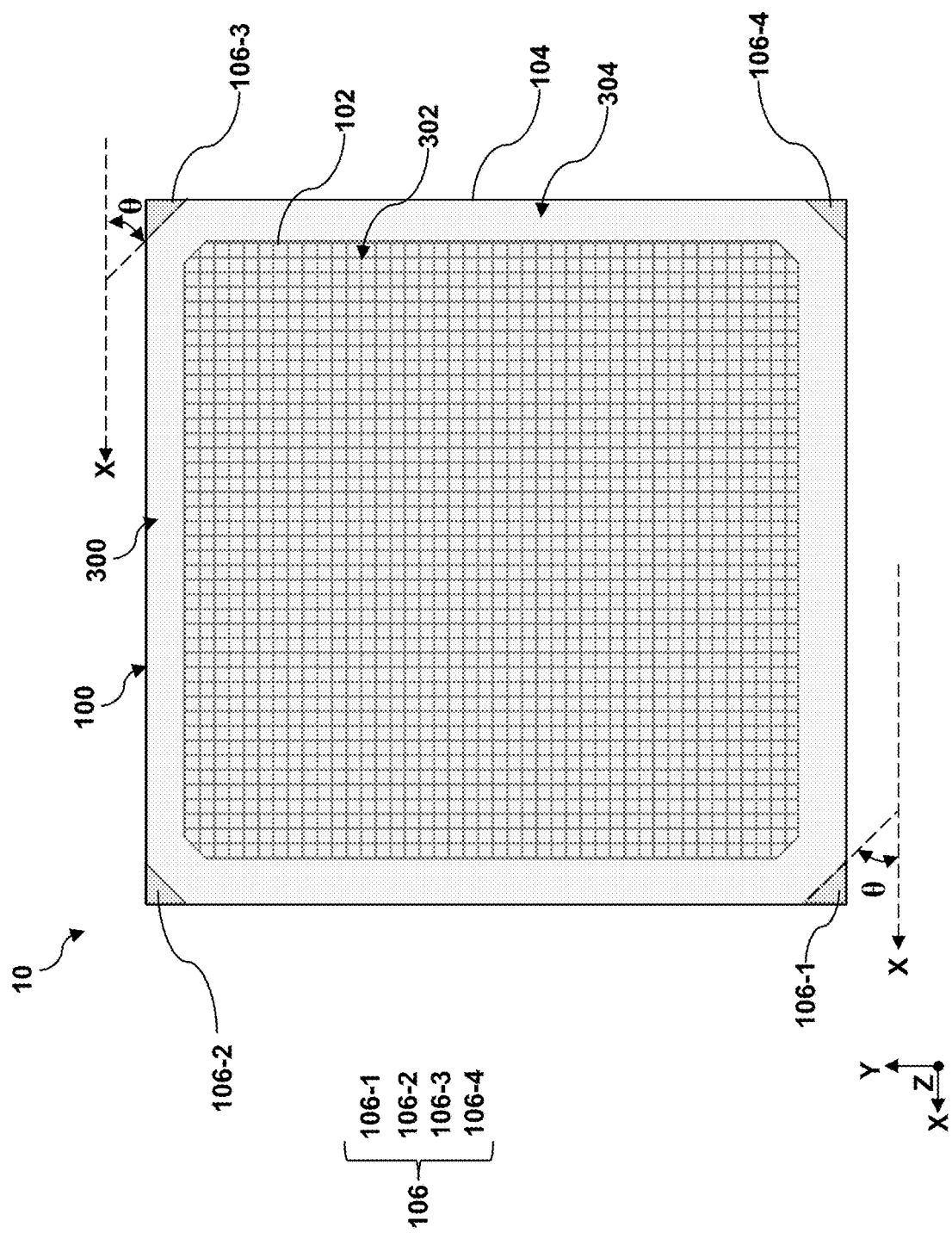
FIG. 4 illustrates a backside top view of the backside interconnect structure in FIG. 1, according to one or more aspects of the present disclosure.

The backside interconnect structure 300 shown in FIG. 1 may include 2 to 8 metal layers. Each of the metal layers includes conductive lines embedded in an intermetal dielectric (IMD) layer. The backside interconnect structure 300 also includes contact vias that vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include aluminum (Al), copper (Cu), titanium nitride (TiN), tungsten (W), or ruthenium (Ru). Reference is now made to FIG. 4, which illustrates a top view of the backside interconnect structure 300 disposed over a back side of the substrate 100. As indicated by the X direction indicator, the X direction shown in FIG. 3 is opposite to the X direction shown in FIG. 4 because FIG. 4 shows the IC chip 10 flipped upside-down. For illustration purposes, the backside interconnect structure 300 is illustrated as a see-though layer in FIG. 4. As shown in FIG. 4, the backside interconnect structure 300 covers the entirety of the back side of the substrate 100 and includes various portions vertically (i.e., along the Z direction) corresponding to various regions of the substrate 100. In the depicted embodiment, the backside interconnect structure 300 includes a backside interconnect region 302 directly over the device region 102 of the substrate 100 and a backside ring region 304 directly over the ring region 104 of the substrate 100. It is noted when the IC chip 10 is flipped over such that its top surface faces upward, the backside interconnect region 302 is directly below the device region 102 and the backside ring region 304 is directly below the ring region 104. Various features of the backside interconnect structure 300 will be described in more detail below. FIG. 5 also illustrates a cross-sectional view across the backside ring region 304 along line A-A' in FIG. 3. To avoid confusion, line A-A' is not separately illustrated in FIG. 4.

Reference is made to FIG. 5, which illustrates an enlarged cross-sectional view along line A-A' in FIG. 3 that extend through the frontside interconnect structure 200, the substrate 100, and the backside interconnect structure 300. In the depicted embodiment, the frontside interconnect structure 200 includes nine (9) metal layers and the backside interconnect structure 300 includes six (6) metal layers. As described above, the frontside interconnect structure 200 and the backside interconnect structure 300 may include more or less metal layers. The nine depicted metal layers in the frontside interconnect structure 200 includes a first metal layer M0, a second metal layer M1, a third metal layer M2, a fourth metal layer M3, a fifth metal layer M4, a sixth metal layer M5, a seventh metal layer M6, an eighth metal layer M7, and a ninth metal layer M8. The six depicted metal layers in the backside interconnect structure 300 includes a first backside metal layer BM0, a second backside metal layer BM1, a third backside metal layer BM2, a fourth backside metal layer BM3, a fifth backside metal layer BM4, and a sixth backside metal layer BM5. Because the backside interconnect structure 300 routes less electrical signals, it tends to have fewer metal layers than the frontside interconnect structure 200.

The device region 102 in the substrate 100 includes functional transistors, such as functional planar transistors, function FinFETs, or functional MBC transistors. Because the ring region 104 is fabricated using the same processes that fabricate the structures in the device region 102, at the FEOL level, the ring region 104 includes transistor-like structures that do not have the electrically connection to function as operational transistors. While the transistor-like structures do not serve any circuit functions, they provide mechanical strength and function to protect the device region 102 from stress and mist ingress. To adequately serve those functions, all features in transistor-like structure in the ring region 104 are much larger than those in the functional transistors in the device region 102. Example transistor-like structures will be described in further detail below in conjunction FIGS. 6-8. At the MEOL level, the ring region 104 may include contact rings that circle completely around the device region 102. For example, contact rings that are coupled to source/drain like structures have a rectangular ring shape or square ring shape that goes completely around the device region 102.

According to the present disclosure, the frontside interconnect structure 200 and the backside interconnect structure 300 include seal ring structure that are disposed vertically above and below the ring region 104. As shown in FIG. 5, the frontside ring region 204 is disposed directly over and vertically aligned with the ring region 104. Similarly, the backside ring region 304 is disposed directly below and vertically aligned with the ring region 104 as well. It follows that, in the depicted embodiment, the frontside ring region 204 is vertically aligned with the backside ring region 304. Each of the frontside ring region 204 and the backside ring region 304 includes a plurality of seal ring walls. As used herein, a seal ring wall includes an ensemble of various conductive features in the metal layers and is defined by a substantially smooth inner wall adjacent to the device region 102 and a substantially smooth outer wall away from the device region 102. For purpose of this application, the inner wall and outer wall of a seal ring wall are substantially smooth because the line rings and via rings at the inner wall and the outer wall are substantially vertically aligned. A seal ring wall also extends completely around the device region 102, thereby protecting the same. In some embodiments, at least one seal ring wall in the frontside ring region 204 is vertically aligned with a seal ring wall in the backside ring region 304. Referring to FIG. 5, the frontside ring region 204 includes a frontside seal ring wall 400 and the backside ring region 304 includes a backside seal ring wall 500. The frontside seal ring wall 400 is vertically aligned with the backside seal ring wall 500. In the depicted embodiment, the frontside seal ring wall 400 and the backside seal ring wall 500 are coterminous along the X direction. That is, the frontside seal ring wall 400 and the underlying backside seal ring wall 500 have the same thickness along the X direction. FIG. 5 also illustrates additional seal ring walls in both frontside ring region 204 and the backside ring region 304. In the depicted embodiments, those seal ring walls are also vertically aligned to enhance the protection of the device region. Because those additional seal ring walls are closer to a scribe line 600 and may be subject to damages during the singulation process, they may be referred to as sacrificial seal ring walls. It is noted that the sacrificial seal ring walls are purposely spaced apart from the frontside seal ring wall 400 and the backside seal ring wall 500.

The signals from the transistors in the device region 102 may be interconnected by way of the lines and vias in the frontside interconnect region 202 (shown in FIG. 3) or the backside interconnect region 302 (shown in FIG. 4). In order to protect the device region 102, the frontside interconnect region 202 and the backside interconnect region 302, seal ring structures are deployed in the substrate 100, the frontside interconnect structure 200 and the backside interconnect structure 300. Experiments and simulation results show that when seal ring walls in the frontside ring region 204 and the seal ring walls in the backside ring region 304 are substantially vertically aligned, the vertically extending seal ring walls provide great protection from stress and mist ingress, which may be introduced, for example, during the singulation or dicing process.

Figure 6:
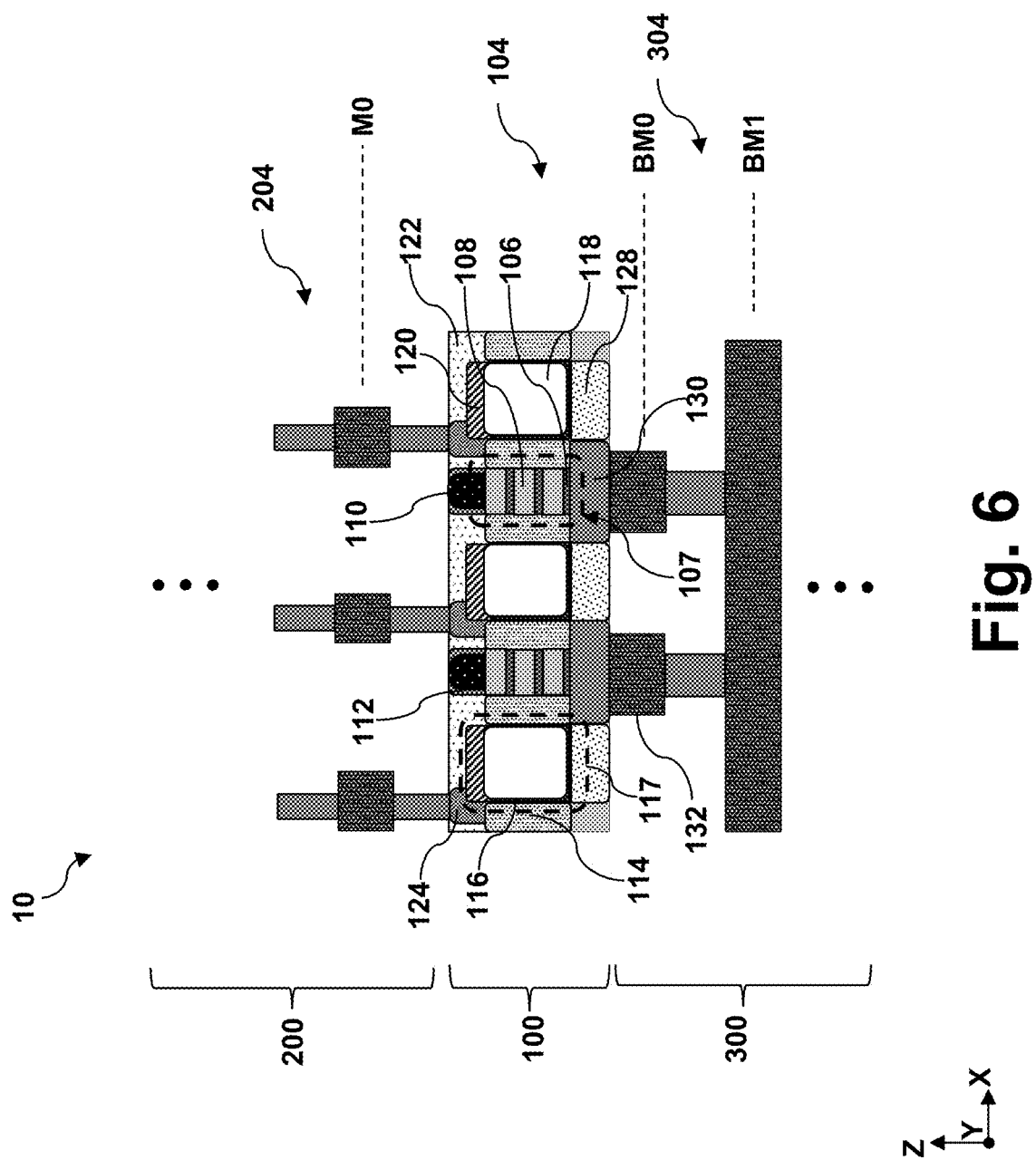
FIGS. 6-8 each illustrate an enlarged fragmentary cross-sectional view of interfaces of a ring region of the substrate, a frontside ring region and a backside ring region, according to one or more aspects of the present disclosure.
Figure 7:
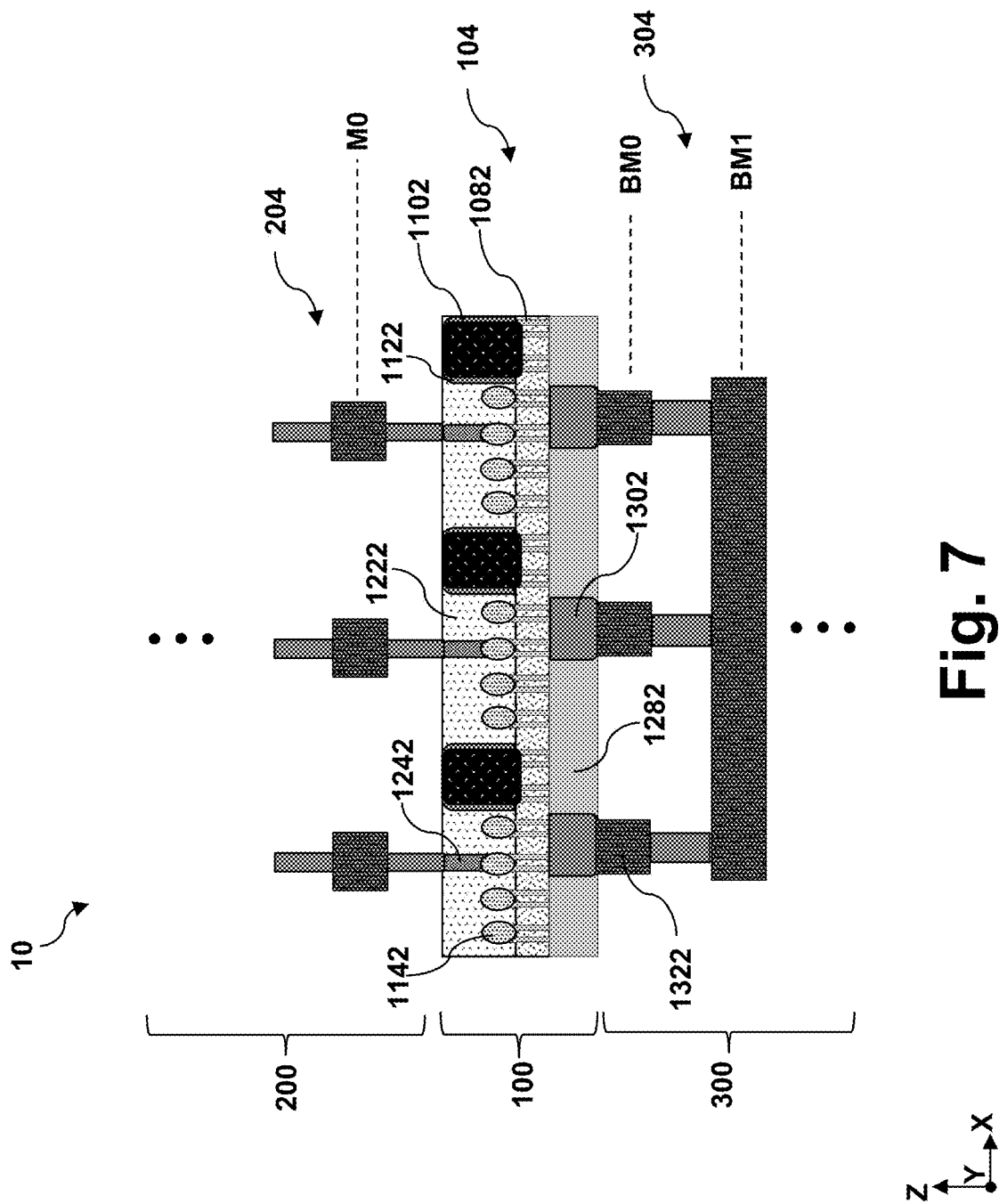
Figure 8:
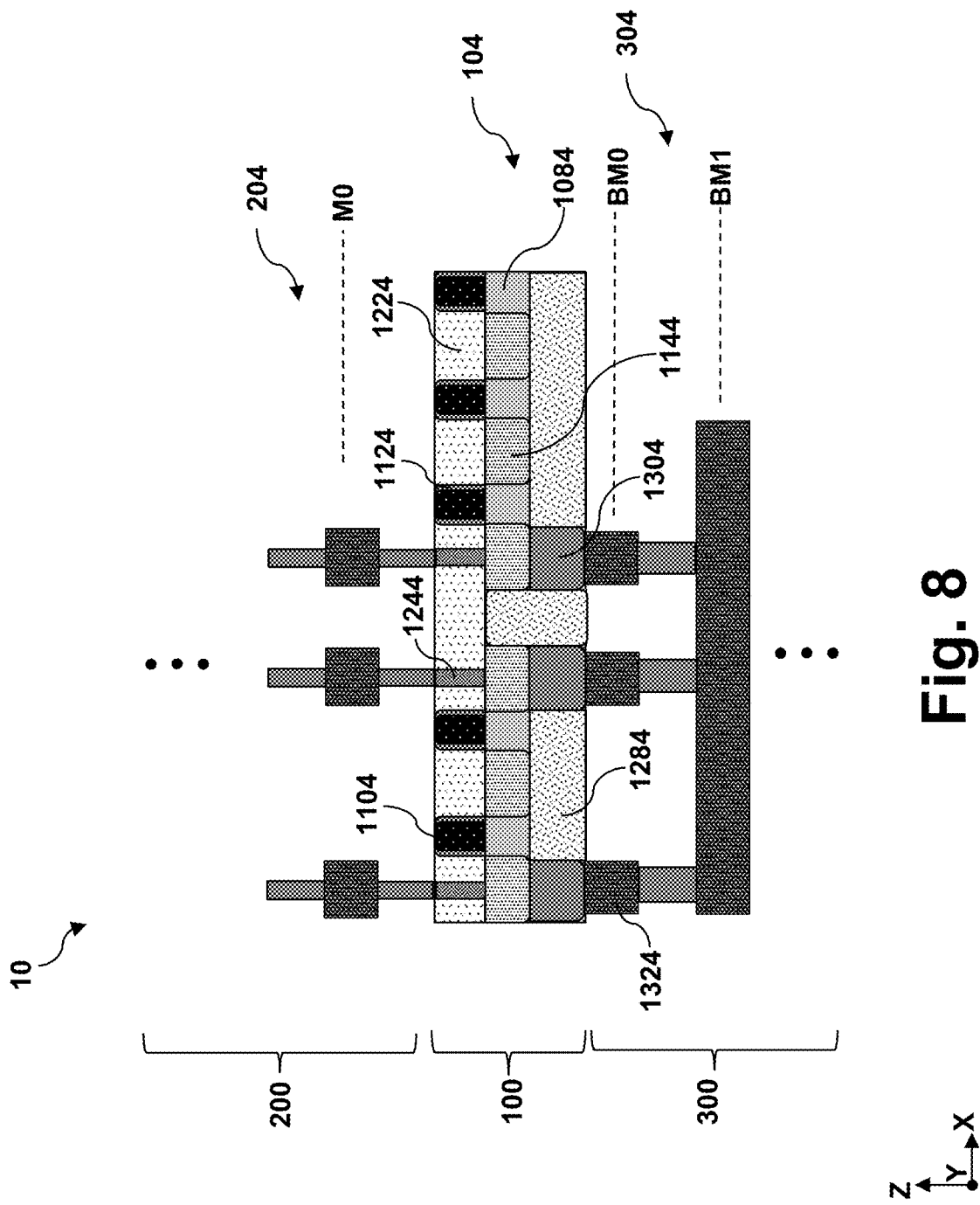

As described above, the seal ring structures in the ring region 104 are fabricated alongside the functional transistors in the device region 102. That said, the seal ring structures in the ring region 104 may be between about 2 times and about 10 times greater than the functional transistors. For example, a gate ring in the ring region 104 may be 2 times to 10 times wider than a gate structure in the device region 102; a contact ring in the ring region 104 may be 2 times to 5 times wider than a source/drain contact in the device region 102. For avoidance of any doubt, as used herein, a ring structure, such as a gate ring, a contact ring, a stack ring, a via ring, a line ring, a contact pad ring, refers to a structure that extends completely around a vertical projection of the device region 102. A ring structure therefore has a closed-loop shape that generally tracks the shape of the IC chip 10. Ring structures in the ring region 104, the frontside ring region 204 and the backside ring region 304 may be different depending on the types of the functional transistors in the device region 102. Example ring structures at the interfaces of the substrate 100, the frontside interconnect structure 200, and the backside interconnect structure 300 are illustrated in FIGS. 6-8.

The dual side seal ring structure may be applied to IC chips where the transistors in the device region 102 are MBC transistors. FIG. 6 illustrates an enlarged fragmentary cross-sectional view of interfaces of the ring region 104 of the substrate 100, the frontside ring region 204 and the backside ring region 304 when the transistors in the device region 102 are MBC transistors. As shown in FIG. 6, at the substrate 100 level, the IC chip 10 includes stack rings 107 formed of first semiconductor layers 105 and second semiconductor layer 108. In some embodiments, the first semiconductor layers 105 are formed of silicon germanium (SiGe) and the second semiconductor layers 108 are formed of silicon (Si). The first semiconductor layer 105 may be referred to as sacrificial layers 105 and the second semiconductor layers 108 may be referred to as channel layers 108. The substrate 100 also includes gate rings 110 disposed over the stack rings 107. Sidewall of the gate rings 110 may be lined by a gate spacer layer 112, which also forms a closed-loop shape as it tracks the surfaces of the gate rings 110. The stack ring 107 is disposed between two epitaxial ring features 114. In the depicted embodiments, the epitaxial ring features 114 and the stack ring 107 disposed therebetween may be disposed directly on a backside contact ring 130. As shown in FIG. 6, the backside contact ring 130 is disposed in a backside dielectric layer 128. Adjacent epitaxial ring features 114 may be spaced apart by a hybrid fin ring 117. A hybrid fin ring 117 shown in FIG. 6 includes an outer layer 116, an inner layer 118, and a helmet layer 120 disposed over the outer layer 116 and the inner layer 118. An interlayer dielectric (ILD) layer 122 is disposed over the epitaxial ring features 114 and the hybrid fin ring 117. Contact rings 124 may extend through the ILD layer 122 to come in contact with the epitaxial ring features 114 and/or the helmet layer 120.

The epitaxial ring features 114, the gate ring 110, the gate spacer layer 112, and the contact rings 124 may have the same compositions as the corresponding structures in the device region 102. For example, the epitaxial ring features 114 have the same composition as the source/drain features in the device region 102, which are generally described above and will not be repeated here. The gate rings 110 have the same composition as the gate structures in the device region 102, which are generally described above and will not be repeated here for brevity. The contact rings 124 may have the same compositions as the source/drain contacts in the device region 102, which are also generally described above and will not be repeated here. The backside dielectric layer 128 may include silicon oxide. The backside contact ring 130 may have the same composition as the frontside source/ drain contact, which is described above. The outer layer 116 may include silicon nitride, silicon oxynitride, silicon oxycarbide, or silicon oxycarbonitride. The inner layer 118 may include silicon oxide, silicate glass, or other low-k dielectric material. In the depicted embodiments, a dielectric constant of the inner layer 118 is smaller than a dielectric constant of the outer layer 116.

It is noted that because the stack ring 107 and the gate ring 110 extend parallel along the same direction, the sacrificial layers 105 in the stack ring 107 are not selectively removed in a gate replacement process. When backside contacts is formed in the device region 102, each of the backside contacts only comes in contact with one source/drain feature from a back side of the substrate 100. In some embodiments, the backside contact rings 130 is disposed below more than one epitaxial ring features 114. In the depicted embodiment, a backside contact ring 130 is disposed directly below two epitaxial ring features 114 and one stack ring 107 sandwiched therebetween.

As shown in FIG. 6, the frontside ring region 204 is disposed directly over the ring region 104. At least some of the contact rings 124 are coupled to a overlying frontside via ring and the frontside via ring may be disposed below further frontside line rings (such as those in the first metal layer M0) or frontside via rings. As described above, the frontside via rings and frontside line rings may form one or more seal ring walls with closed inner and outer walls. Similar scheme may apply to the backside ring region 304. As illustrated in FIG. 6, a backside line ring 132 may be disposed below and in contact with the backside contact ring 130 and is coupled to further backside line rings and backside via rings. It is noted, at least in some embodiments of the present disclosure, the metal features in the frontside ring region 204 and the backside ring region 304 may be ring-shaped or closed-loop that extends around the device region 102, thereby protecting the same.

The dual side seal ring structure may be applied to IC chips where the transistors in the device region 102 are FinFETs. FIG. 7 illustrates an enlarged fragmentary cross-sectional view of interfaces of the ring region 104 of the substrate 100, the frontside ring region 204 and the backside ring region 304 when the transistors in the device region 102 are FinFETs. As shown in FIG. 7, at the substrate 100 level, the IC chip 10 includes fin rings 1082 formed of silicon (Si) or other semiconductor materials. In the depicted embodiment, the fin rings 1082 include silicon (Si). A gate ring 1102 may be disposed over a plurality of fin rings 1082. In the depicted embodiments, each gate ring 1102 is disposed over four fin rings 1082. Sidewall of each of the gate rings 1102 may be lined by a gate spacer layer 1122, which continuously extends along the gate ring 1102 to have a closed-loop shape as well. The IC chip 10 in FIG. 7 also includes epitaxial ring features 1142 that are each disposed over one or more fin rings 1082. In the depicted embodiments, each of the epitaxial ring features 1142 is disposed over two fin rings 1082. Some of the epitaxial ring features 1142 are coupled to overlying contact rings 1242 that are disposed in an ILD layer 1222. The IC chip 10 in FIG. 7 also includes backside contact rings 1302 embedded in a backside dielectric layer 1282. Each of the backside contact rings 1302 may be disposed directly below more than two fin rings 1082. In the depicted embodiment, each of the backside contact rings 1302 is disposed directly below and in contact with four (4) fin rings 1082. This configuration is different from backside contacts in the backside interconnect region 302 where each of the backside contact is disposed below at most two fins and is electrically coupled to a source/drain feature by way of a conductive feature that may extend between those two fins. As shown in FIG. 7, the backside contact rings 1302 is electrically isolated and physically spaced apart from any of the epitaxial ring features 1142. It can be seen that the backside contact rings 1302 of the present disclosure are implemented to serve mechanical functions as parts of the seal ring structure. Like the ring structures in the ring region 104, the frontside ring region 204 and the backside ring region 304, the backside contact rings 1302 are not electrically coupled to any circuitry in the device region 102 and may be electrically floating.

The fin rings 1082, the epitaxial ring features 1142, the gate ring 1102, the gate spacer layer 1122, and the contact rings 1242 may have the same compositions as the corresponding structures in the device region 102. For example, the epitaxial ring features 1142 have the same composition as the source/drain features in the device region 102, which are generally described above and will not be repeated here. The gate rings 1102 have the same composition as the gate structures in the device region 102, which are generally described above and will not be repeated here for brevity. The contact rings 1242 may have the same compositions as the source/drain contacts in the device region 102, which are also generally described above and will not be repeated here. The backside dielectric layer 1282 may include silicon oxide. The backside contact ring 1302 may have the same composition as the frontside source/drain contact, which is described above.

As shown in FIG. 7, the frontside ring region 204 is disposed directly over the ring region 104. At least some of the contact rings 1242 are coupled to a overlying frontside via ring and that frontside via ring may be disposed below further frontside line rings (such as those in the first metal layer M0) or frontside via rings. As described above, the frontside via rings and frontside line rings may form one or more seal ring walls with closed sidewalls. Similar scheme may apply to the backside ring region 304. As illustrated in FIG. 7, a backside line ring 1322 may be disposed below and in contact with the backside contact ring 1302 and is coupled to further backside line rings and backside via rings. It is noted, at least in some embodiments of the present disclosure, the metal features in the frontside ring region 204 and the backside ring region 304 may be ring-shaped or closed-loop that extends around the device region 102, thereby protecting the same.

The dual side seal ring structure may be applied to IC chips where the transistors in the device region 102 are planar devices. FIG. 8 illustrates an enlarged fragmentary cross-sectional view of interfaces of the ring region 104 of the substrate 100, the frontside ring region 204 and the backside ring region 304 when the transistors in the device region 102 are planar devices, such as planar field effect transistors (planar FETs). As shown in FIG. 8, at the substrate 100 level, the IC chip 10 includes semiconductor rings 1084 formed of silicon (Si) or other semiconductor materials. In the depicted embodiment, the semiconductor rings 1084 include silicon (Si). A gate ring 1104 may be disposed over at least one semiconductor ring 1084. In the depicted embodiments, each gate ring 1104 is disposed over one semiconductor rings 1084. Sidewall of each of the gate rings 1104 may be lined by a gate spacer layer 1124, which continuously extends along the gate ring 1104 to have a closed-loop shape as well. The IC chip 10 in FIG. 8 also includes epitaxial ring features 1144 that are each disposed over alongside the semiconductor rings 1084. Epitaxial ring features 1144 in FIG. 8 may be formed by epitaxial deposition, ion implantation, or a combination thereof. Some of the epitaxial ring features 1144 are coupled to overlying contact rings 1244 that are disposed in an ILD layer 1224. The IC chip 10 in FIG. 8 also includes backside contact rings 1304 embedded in a backside dielectric layer 1284. Each of the backside contact rings 1304 may be disposed directly below at least one epitaxial ring feature 1144. In the depicted embodiment, each of the backside contact rings 1304 is disposed directly below and in contact with one epitaxial ring feature 1144. It is noted that because planar devices are usually larger in dimension, each of the backside contact rings 1304 may not span under more than one epitaxial ring feature 1144.

The semiconductor rings 1084, the epitaxial ring features 1144, the gate ring 1104, the gate spacer layer 1124, and the contact rings 1244 may have the same compositions as the corresponding structures in the device region 102. For example, the epitaxial ring features 1144 have the same composition as the source/drain features in the device region 102, which are generally described above and will not be repeated here. The gate rings 1104 have the same composition as the gate structures in the device region 102, which are generally described above and will not be repeated here for brevity. The contact rings 1244 may have the same compositions as the source/drain contacts in the device region 102, which are also generally described above and will not be repeated here. The backside dielectric layer 1284 may include silicon oxide. The backside contact ring 1304 may have the same composition as the frontside source/drain contact, which is described above.

As shown in FIG. 8, the frontside ring region 204 is disposed directly over the ring region 104. At least some of the contact rings 1244 are coupled to a overlying frontside via ring and that frontside via ring may be disposed below further frontside line rings (such as those in the first metal layer M0) or frontside via rings. As described above, the frontside via rings and frontside line rings may form one or more seal ring walls with closed sidewalls. Similar scheme may apply to the backside ring region 304. As illustrated in FIG. 8, a backside line ring 1324 may be disposed below and in contact with the backside contact ring 1304 and is coupled to further backside line rings and backside via rings. It is noted, at least in some embodiments of the present disclosure, the metal features in the frontside ring region 204 and the backside ring region 304 may be ring-shaped or closed-loop that extends around the device region 102, thereby protecting the same.

Referring back to FIG. 5, the IC chip 10 according to the present disclosure may further include passivation layers, contact pad rings, and polymer layers on external surfaces of the frontside interconnect structure 200 and the backside interconnect structure 300. As shown in FIG. 5, over the frontside ring region 204, the IC chip 10 may include a first frontside passivation layer 240, a second frontside passivation layer 270, frontside pad via rings 252 and 262, frontside pad rings 254 and 264, and a frontside polymer layer 280 disposed over the second frontside passivation layer 270. The frontside pad via ring 252 and the frontside pad ring 254 may be collectively referred to a frontside pad ring structure 250. The frontside pad via ring 262 and the frontside pad ring 264 may be collectively referred to a frontside pad ring structure 260. The first frontside passivation layer 240, the second frontside passivation layer 270, and the frontside polymer layer 280 may be collectively referred to as the frontside passivation structure.

The frontside pad via ring 252 and 262 are embedded in the first frontside passivation layer 240. The frontside pad rings 254 and 264 are each disposed over and in contact with the corresponding frontside pad via rings 252 and 262. The frontside pad rings 254 and 264 may be said to be embedded in the second frontside passivation layer 270. The frontside pad rings 254 and 264 may extend completely through the first frontside passivation layer 240 to come in direct contact with an underlying sealing wall. For example, the frontside pad via ring 252 extends through the first frontside passivation layer 240 to come in contact with a top metal layer of a frontside seal ring wall 400. Similarly, the frontside pad via ring 262 comes in direct contact with a top metal layer of another frontside seal ring wall. In the depicted embodiments, a frontside pad ring and the underlying frontside pad via ring may be continuous without an observable interface. The frontside polymer layer 280 does not cover an entirety of the frontside ring region 204 and is spaced apart from the scribe line 600 where IC chip is cut. The arrangement prevents undesirable debris from being generated when a die sawing process is performed on or near the frontside polymer layer 280. In the depicted embodiment, an outer edge of the frontside polymer layer 280 is aligned with a first vertical line 420 and the frontside polymer layer 280 completely covers the frontside seal ring wall 400.

In some embodiments, the first frontside passivation layer 240 and the second frontside passivation layer 270 may include undoped silicate glass (USG), silicon nitride, silicon oxide, or silicon oxynitride. The frontside pad via rings 252 and 262 and the frontside pad rings 254 and 264 may include aluminum (Al), copper (Cu), aluminum-copper (Al—Cu), a suitable metal, or a suitable metal alloy. The frontside polymer layer 280 may include epoxy, polyimide (PI), benzocyclobutene (BCB), or polybenzoxazole (PBO). In one embodiment, the frontside polymer layer 280 includes polyimide (PI).

Figure 9:
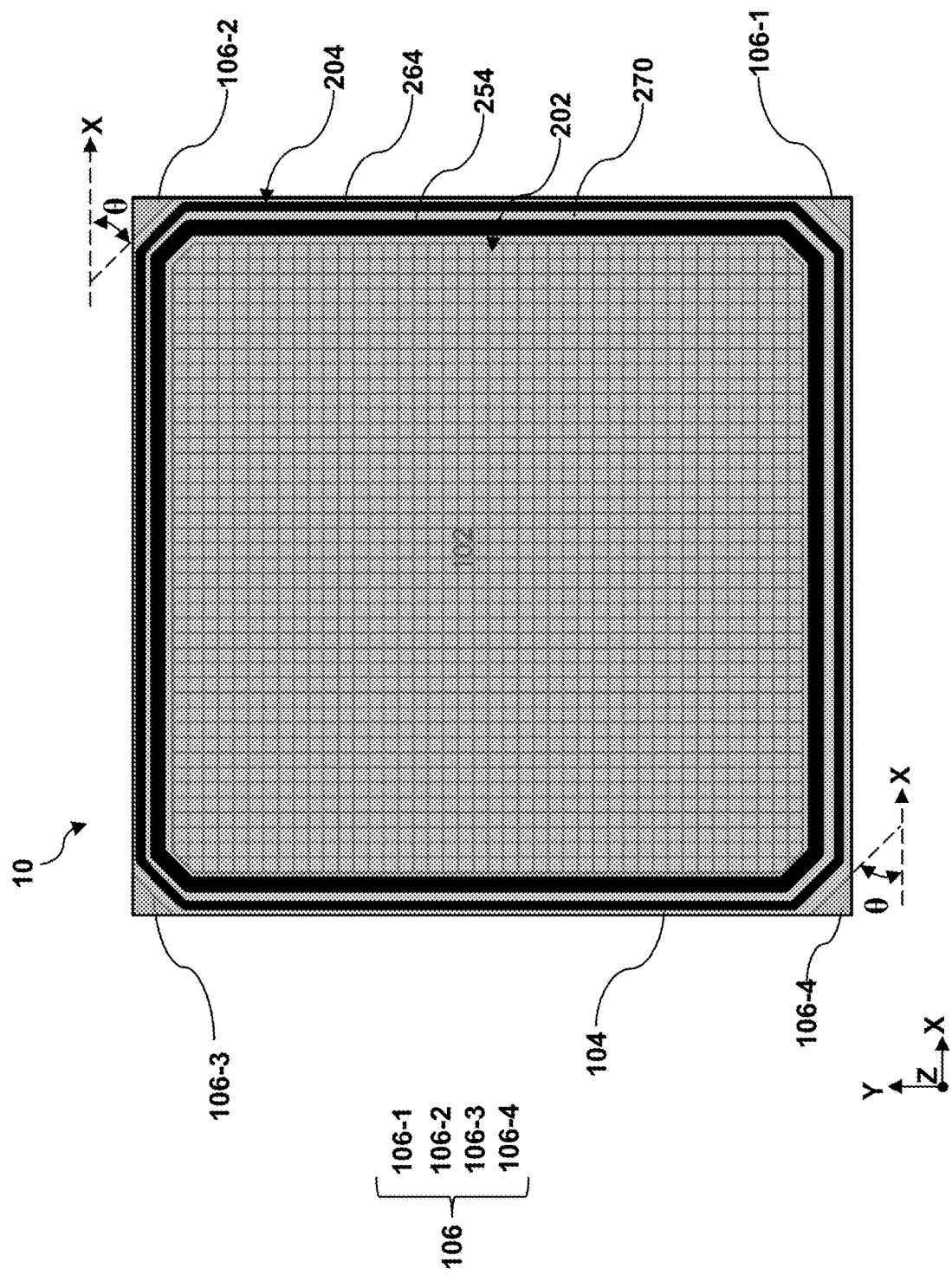
FIG. 9 illustrates a frontside top view of frontside pad rings over the frontside interconnect structure in FIG. 1, according to one or more aspects of the present disclosure.
Figure 10:
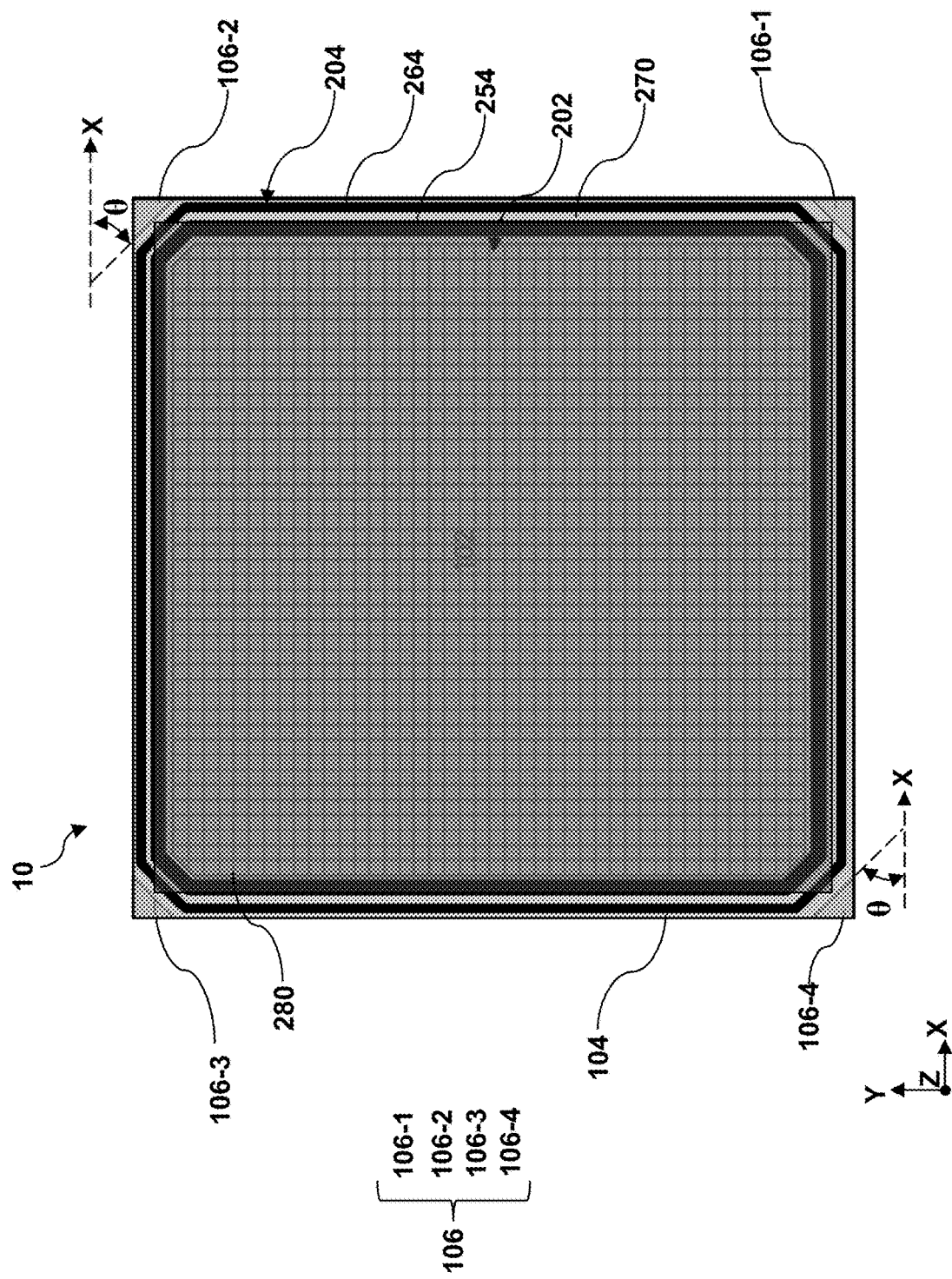
FIG. 10 illustrates a frontside top view of frontside polyimide layer over the frontside interconnect structure in FIG. 1, according to one or more aspects of the present disclosure.

Reference is made to FIG. 9, which illustrates a frontside top view of the frontside pad rings 254 and 264 relative to the IC chip 10. As shown in FIG. 9, each of the frontside pad rings 254 and 264 substantially tracks the shape of the IC chip 10 and go completely around a vertical projection area of the device region 102. The frontside pad rings 254 and 264 therefore are closed loops that enclose and protect the frontside interconnect region 202 and the device region 102. FIG. 10 illustrates a frontside top view of the second frontside passivation layer 270 and the frontside polymer layer 280. As shown in FIG. 10, while the second frontside passivation layer 270 extends all the way to edges of the IC chip 10, the frontside polymer layer 280 does not extend all the way to the edges of the IC chip 10 to prevent debris generation.

Referring back to FIG. 5, below the backside ring region 304, the IC chip 10 may include a first backside passivation layer 340, a second backside passivation layer 370, backside pad via rings 352 and 362, backside pad rings 354 and 364, and a backside polymer layer 380 disposed over the second backside passivation layer 370. The backside pad via ring 352 and the backside pad ring 354 may be collectively referred to a backside pad ring structure 350. The backside pad via ring 362 and the backside pad ring 364 may be collectively referred to a backside pad ring structure 360. The first backside passivation layer 340, the second backside passivation layer 370, and the backside polymer layer 380 may be collectively referred to as the backside passivation structure.

The backside pad via ring 352 and 362 are embedded in the first backside passivation layer 340. The backside pad rings 354 and 364 are each disposed below and in contact with the corresponding backside pad via rings 352 and 362. The backside pad rings 354 and 364 may be said to be embedded in the second backside passivation layer 370. The backside pad rings 354 and 364 may extend completely through the first backside passivation layer 340 to come in direct contact with an overlying sealing wall. For example, the backside pad via ring 352 extends through the first backside passivation layer 340 to come in contact with a bottom metal layer of a backside seal ring wall 500. Similarly, the backside pad via ring 362 comes in direct contact with a bottom metal layer of another backside seal ring wall. In the depicted embodiments, a backside pad ring and the overlying backside pad via ring may be continuous without an observable interface. The backside polymer layer 380 does not cover an entirety of the backside ring region 304 and is spaced apart from the scribe line 600 where IC chip is cut. The arrangement prevents undesirable debris from being generated when a die sawing process is performed on or near the backside polymer layer 380. In the depicted embodiment, an outer edge of the backside polymer layer 380 is also aligned with the first vertical line 420 and the backside polymer layer 380 is disposed directly below the backside seal ring wall 500.

In some embodiments, the first backside passivation layer 340 and the second backside passivation layer 370 may include undoped silicate glass (USG), silicon nitride, silicon oxide, or silicon oxynitride. The backside pad via rings 352 and 362 and the backside pad rings 354 and 364 may include aluminum (Al), copper (Cu), aluminum-copper (Al—Cu), a suitable metal, or a suitable metal alloy. The backside polymer layer 380 may include epoxy, polyimide (PI), benzocyclobutene (BCB), or polybenzoxazole (PBO). In one embodiment, the backside polymer layer 380 includes polyimide (PI).

Figure 11:
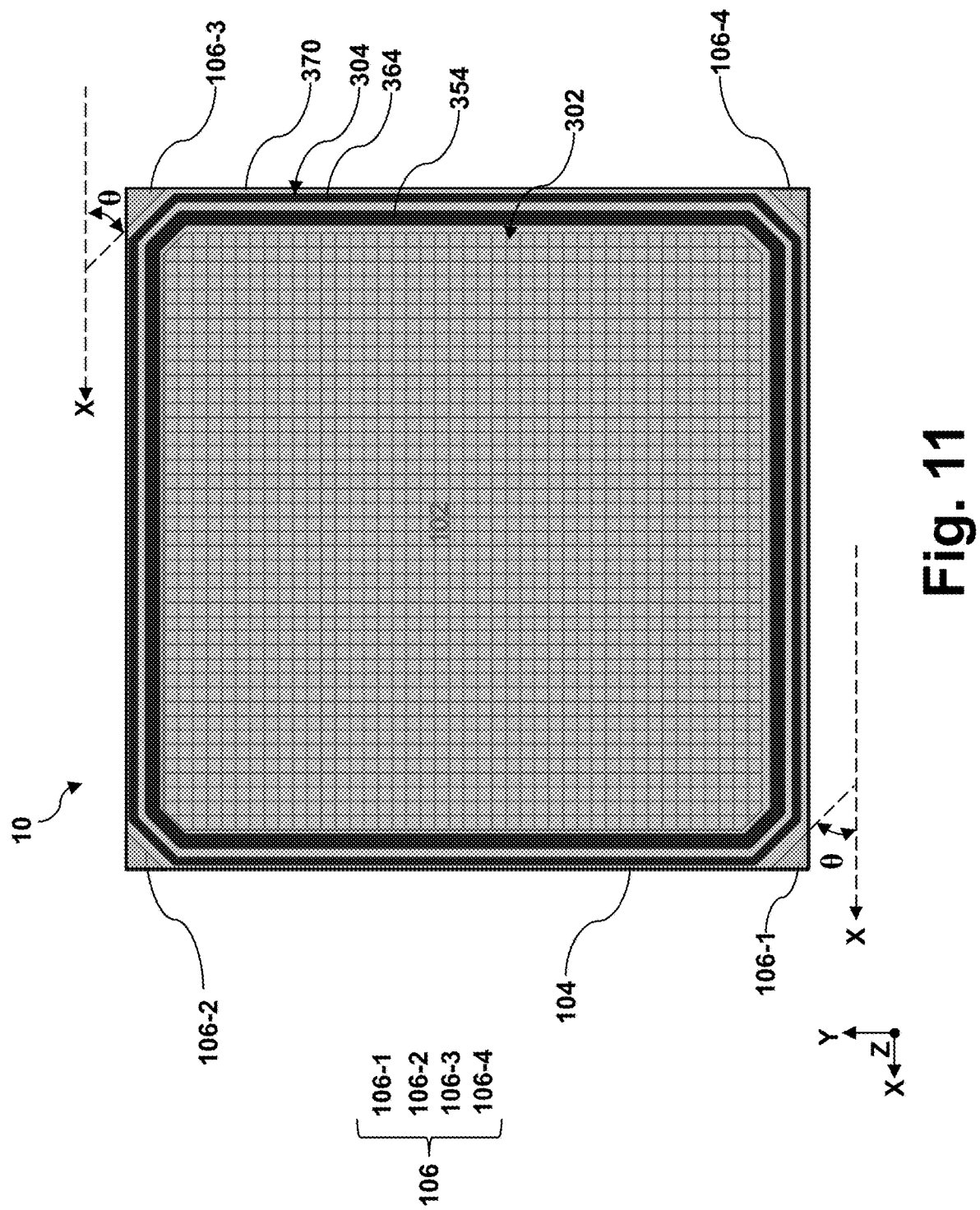
FIG. 11 illustrates a backside top view of backside pad rings over the backside interconnect structure in FIG. 1, according to one or more aspects of the present disclosure.
Figure 12:
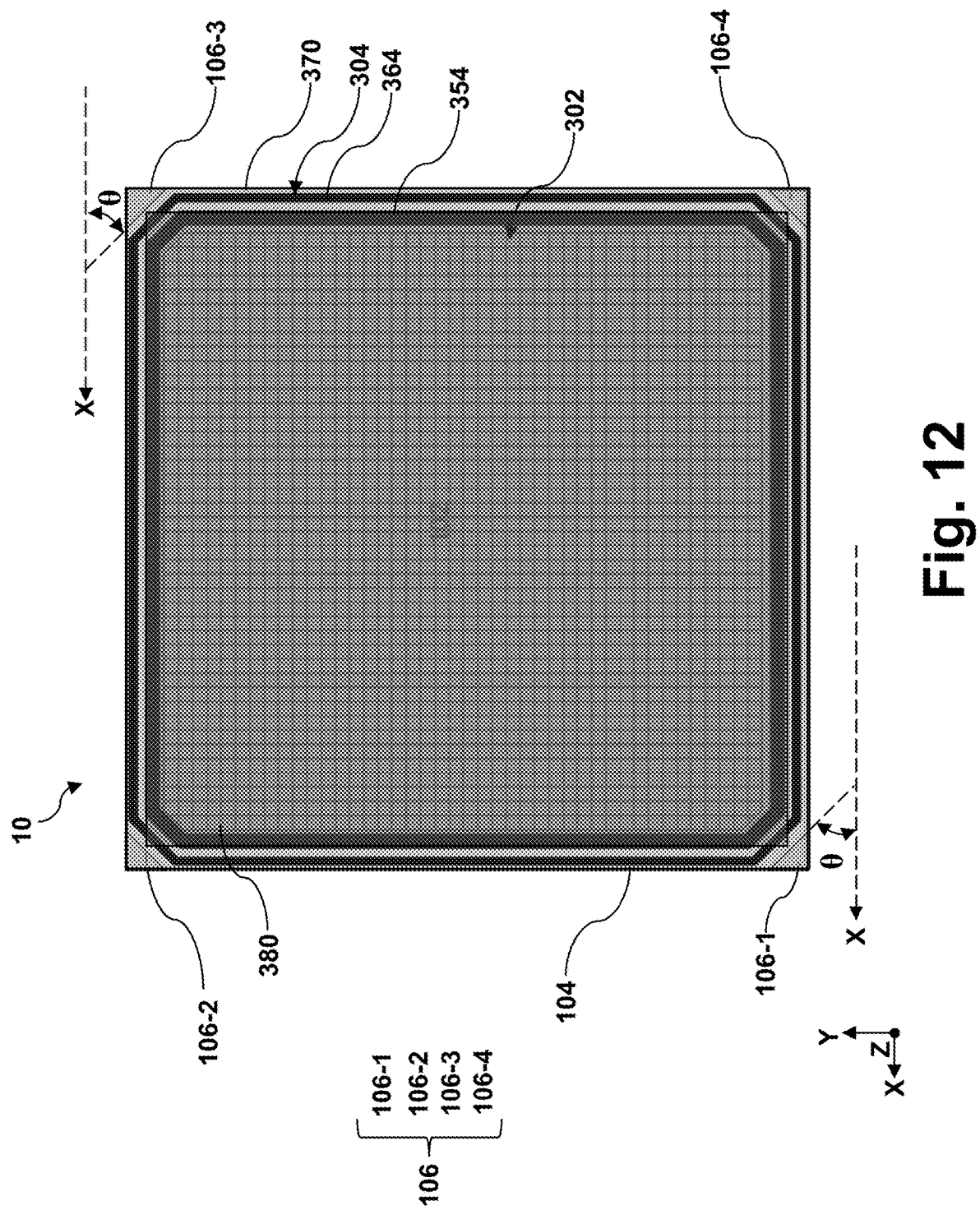
FIG. 12 illustrates a backside top view of backside polyimide layer over the backside interconnect structure in FIG. 1, according to one or more aspects of the present disclosure.

Reference is then made to FIG. 11, which illustrates a backside top view of the backside pad rings 354 and 364 relative to the IC chip 10. As shown in FIG. 11, each of the backside pad rings 354 and 364 substantially tracks the shape of the IC chip 10 and go completely around a vertical projection area of the device region 102. The backside pad rings 354 and 364 therefore are closed loops that enclose and protect the backside interconnect region 302 and the device region 102. FIG. 12 illustrates a backside top view of the second backside passivation layer 370 and the backside polymer layer 380. As shown in FIG. 12, while the second backside passivation layer 370 extends all the way to edges of the IC chip 10, the backside polymer layer 380 does not extend all the way to the edges of the IC chip 10 to prevent debris generation.

Reference is once again made to FIG. 5. In order to provide optimal stress and mist protection to the device region 102, the frontside interconnect region 202 and the backside interconnect region 302, each of the frontside seal ring walls may be vertically aligned with one of the backside seal ring walls. For example, the frontside seal ring wall 400 is vertically aligned with the backside seal ring wall 500. That is, the inner surface of the frontside seal ring wall 400 is aligned with the inner surface of the backside seal ring wall 500 and the outer surface of the frontside seal ring wall 400 is aligned with the outer surface of the backside seal ring wall 500. As shown in FIG. 5, this frontside-backside wall alignment is also implemented to other frontside seal ring walls and backside seal ring walls, including those that are closer to the scribe line 600 and may be damaged during the singulation process. This vertical alignment configuration is also implemented to pad via rings, pad rings, and polymer layers. As shown in FIG. 5, each of the frontside pad rings is vertically aligned with one of the backside pad rings. For example, outer edges of the frontside pad rings 254 and the backside pad rings 354 are aligned along a second vertical line 440 and inner edges of the frontside pad rings 254 and the backside pad rings 354 are aligned along a third vertical line 460. Put differently, the frontside pad ring structures 250 and 260 may be vertically aligned with backside pad ring structures 350 and 360, respectively. As described above, the outer edges of the frontside polymer layer 280 and the backside polymer layer 380 are aligned along the first vertical line 420.

In one exemplary aspect, the present disclosure is directed to a semiconductor structure. The semiconductor structure includes a substrate having a device region and a ring region surrounding the device region, a frontside interconnect structure disposed over the substrate and including a frontside interconnect region and a frontside seal ring region, and a backside interconnect structure disposed below the substrate and including a backside interconnect region and a backside seal ring region. The frontside interconnect region is disposed over the device region and the backside interconnect region is disposed below the device region. The frontside seal ring region is disposed over the ring region and the backside seal ring region is disposed below the ring region.

In some embodiments, the frontside seal ring region includes a plurality of frontside conductive rings that extend completely around the frontside interconnect region. In some embodiments, the backside seal ring region includes a plurality of backside conductive rings that extend completely around the backside interconnect region. In some implementations, the ring region includes a plurality of source/drain contact rings that extend completely around the device region. In some instances, the backside seal ring region includes a plurality of backside contact rings and each of the plurality of the backside contact rings is electrically and physically coupled to at least one of the plurality of source/drain contact rings. In some embodiments, each of plurality of the backside contact rings extend completely around the backside interconnect region. In some embodiments, the backside seal ring region further includes a topmost metal layer adjacent the plurality of backside contact rings and a bottommost metal layer away from the plurality of backside contact rings. In some instances, the semiconductor structure may further include a first passivation layer disposed below and in contact with the bottommost metal layer, a second passivation layer disposed below and in contact with the first passivation layer, and at least one backside contact pad ring disposed between the first passivation layer and the second passivation layer. In some embodiments, the at least one backside contact pad ring extends completely around the backside interconnect region.

In another exemplary aspect, the present disclosure is directed to a semiconductor structure. The semiconductor structure includes a substrate having a device region and a ring region surrounding the device region, a frontside interconnect structure disposed over the substrate, a backside interconnect structure disposed below the substrate, a first backside passivation layer disposed below the backside interconnect structure, and a backside pad ring disposed below the first backside passivation layer. The backside pad ring extends completely around a vertical projection of the device region.

In some embodiments, the semiconductor structure may further include a first frontside passivation layer disposed over the frontside interconnect structure and a frontside pad ring disposed over the first frontside passivation layer. The frontside pad ring extends completely around the vertical projection of the device region. In some implementations, the backside pad ring is vertically aligned with the frontside pad ring. In some instances, the semiconductor structure may further include a frontside polyimide layer disposed over the frontside pad ring, and a backside polyimide layer disposed below the backside pad ring. An outer edge of the frontside polyimide layer is vertically aligned with an outer edge of the backside polyimide layer. In some embodiments, the semiconductor structure may further include a second backside passivation layer disposed between the first backside passivation layer and the backside polyimide layer, and a second frontside passivation layer disposed between the first frontside passivation layer and the frontside polyimide layer. In some embodiments, the first backside passivation layer, the second backside passivation layer, the first frontside passivation layer, and the second frontside passivation layer include silicon nitride.

In yet another exemplary aspect, the present disclosure is directed to a structure. The structure includes a substrate having a device region and a ring region surrounding the device region, a frontside interconnect structure disposed over the substrate, and a backside interconnect structure disposed below the substrate and including a backside interconnect region and a backside seal ring region. The backside interconnect region is disposed below the device region and the backside seal ring region is disposed below the ring region.

In some embodiments, the frontside interconnect structure includes a frontside interconnect region and a frontside seal ring region, the frontside interconnect region is disposed over the device region, and the frontside seal ring region is disposed over the ring region. In some embodiments, the structure may further include a frontside pad ring disposed over the frontside interconnect structure, and a backside pad ring disposed below the backside interconnect structure. In some implementations, the structure may further include a frontside polyimide layer disposed over the frontside pad ring and a backside polyimide layer disposed below the backside pad ring. An outer edge of the frontside polyimide layer is vertically aligned with an outer edge of the backside polyimide layer. In some embodiments, the backside seal ring region includes a seal ring wall disposed between the backside pad ring and the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate comprising a device region and a ring region surrounding the device region;
    a frontside interconnect structure disposed over the substrate and comprising a frontside interconnect region and a frontside seal ring region; and
    a backside interconnect structure disposed below the substrate and comprising a backside interconnect region and a backside seal ring region,
    wherein the frontside interconnect region is disposed over the device region and the backside interconnect region is disposed below the device region,
    wherein the frontside seal ring region is disposed over the ring region and the backside seal ring region is disposed below the ring region,
    wherein the ring region comprises a plurality of gate rings that surround the device region,
    wherein the ring region comprises a plurality of source/drain contact rings that extend completely around the device region.

2. The semiconductor structure of claim 1,
    wherein the frontside seal ring region comprises a plurality of frontside conductive rings that extend completely around the frontside interconnect region.

3. The semiconductor structure of claim 1,
    wherein the backside seal ring region comprises a plurality of backside conductive rings that extend completely around the backside interconnect region.

4. The semiconductor structure of claim 1,
    wherein the ring region comprises a plurality of hybrid fin rings,
    wherein a portion of at least one of the plurality of source/drain contact rings lands on one of the plurality of hybrid fin rings.

5. The semiconductor structure of claim 1,
   wherein the backside seal ring region comprises a plurality of backside contact rings,
   wherein each of the plurality of the backside contact rings is electrically and physically coupled to at least one of the plurality of source/drain contact rings.

6. The semiconductor structure of claim 5, wherein each of plurality of the backside contact rings extend completely around the backside interconnect region.

7. The semiconductor structure of claim 5, wherein the backside seal ring region further comprises a topmost metal layer adjacent the plurality of backside contact rings and a bottommost metal layer away from the plurality of backside contact rings.

8. The semiconductor structure of claim 7, further comprising:
   a first passivation layer disposed below and in contact with the bottommost metal layer;
   a second passivation layer disposed below and in contact with the first passivation layer; and
   at least one backside contact pad ring disposed between the first passivation layer and the second passivation layer.

9. The semiconductor structure of claim 8, wherein the at least one backside contact pad ring extends completely around the backside interconnect region.

10. A semiconductor structure, comprising:
    a substrate comprising a device region and a ring region surrounding the device region;
    a frontside interconnect structure disposed over the substrate;
    a backside interconnect structure disposed below the substrate,
    a first backside passivation layer disposed below the backside interconnect structure; and
    a backside pad ring disposed below the first backside passivation layer,
    wherein the backside pad ring extends completely around a vertical projection of the device region,
    wherein the ring region comprises:
       a plurality of epitaxial ring features that completely surround the device region,
       a plurality of frontside contact rings that completely surround the device region, and
       a plurality of backside contact rings that completely surround the device region,
    wherein the plurality of frontside contact rings are adjacent the frontside interconnect structure and away from the backside interconnect structure,
    wherein the plurality of backside contact rings are adjacent the backside interconnect structure and away from the frontside interconnect structure,
    wherein one of the plurality of frontside contact rings interfaces a top surface of one of the plurality of epitaxial ring features,
    wherein one of the plurality of backside contact rings interfaces a bottom surface of one of the plurality of epitaxial ring features.

11. The semiconductor structure of claim 10, further comprising:
    a first frontside passivation layer disposed over the frontside interconnect structure; and
    a frontside pad ring disposed over the first frontside passivation layer,
    wherein the frontside pad ring extends completely around the vertical projection of the device region.

12. The semiconductor structure of claim 11, wherein the backside pad ring is vertically aligned with the frontside pad ring.

13. The semiconductor structure of claim 11, further comprising:
    a frontside polyimide layer disposed over the frontside pad ring; and
    a backside polyimide layer disposed below the backside pad ring,
    wherein an outer edge of the frontside polyimide layer is vertically aligned with an outer edge of the backside polyimide layer.

14. The semiconductor structure of claim 13, further comprising:
    a second backside passivation layer disposed between the first backside passivation layer and the backside polyimide layer; and
    a second frontside passivation layer disposed between the first frontside passivation layer and the frontside polyimide layer.

15. The semiconductor structure of claim 14, wherein the first backside passivation layer, the second backside passivation layer, the first frontside passivation layer, and the second frontside passivation layer comprise silicon nitride.

16. A structure, comprising:
    a substrate comprising a device region and a ring region surrounding the device region;
    a frontside interconnect structure disposed over the substrate; and
    a backside interconnect structure disposed below the substrate and comprising a backside interconnect region and a backside seal ring region,
    wherein the backside interconnect region is disposed below the device region,
    wherein the backside seal ring region is disposed below the ring region,
    wherein the ring region comprises a plurality of epitaxial ring features that surround the device region,
    wherein the ring region further comprises a plurality of hybrid fin rings,
    wherein adjacent ones of the plurality of epitaxial ring features are spaced apart from one another by one of the plurality of hybrid fin rings.

17. The structure of claim 16,
    wherein the frontside interconnect structure comprises a frontside interconnect region and a frontside seal ring region,
    wherein the frontside interconnect region is disposed over the device region,
    wherein the frontside seal ring region is disposed over the ring region.

18. The structure of claim 16, further comprising:
    a frontside pad ring disposed over the frontside interconnect structure; and
    a backside pad ring disposed below the backside interconnect structure.

19. The structure of claim 18, further comprising:
    a frontside polyimide layer disposed over the frontside pad ring; and
    a backside polyimide layer disposed below the backside pad ring,
    wherein an outer edge of the frontside polyimide layer is vertically aligned with an outer edge of the backside polyimide layer.

20. The structure of claim 19, where the backside seal ring region comprises a seal ring wall disposed between the backside pad ring and the substrate.

\* \* \* \* \*